United States Patent [19]

Tanaka et al.

[11] Patent Number: 5,082,545
[45] Date of Patent: Jan. 21, 1992

[54] SPUTTERING APPARATUS

[75] Inventors: Kunio Tanaka; Youichi Ohnishi; Masahide Yokoyama, all of Osaka, Japan

[73] Assignee: Matsushita Electric Industrial Co., Ltd., Osaka, Japan

[21] Appl. No.: 450,920

[22] Filed: Dec. 14, 1989

[30] Foreign Application Priority Data

Dec. 15, 1988 [JP] Japan ................. 63-317477

[51] Int. Cl.$^5$ ................................................ C23C 14/34
[52] U.S. Cl. .................... 204/298.03; 204/192.1; 204/192.13; 204/298.07; 204/298.09; 204/298.02
[58] Field of Search ............... 204/192.11, 298.06, 204/298.07, 298.09, 298.03, 192.1, 192.13, 298.02

[56] References Cited

U.S. PATENT DOCUMENTS

| | | | |
|---|---|---|---|
| 3,472,751 | 10/1969 | King | 204/298.04 X |
| 3,616,452 | 10/1971 | Bessot et al. | 204/298.04 X |
| 4,033,843 | 7/1977 | Krikorian et al. | 204/298.04 X |
| 4,046,666 | 9/1977 | McClanahan et al. | 204/298.04 |
| 4,407,708 | 10/1983 | Landau | 204/298.03 X |
| 4,487,675 | 12/1984 | Meckel | 204/298.03 X |
| 4,664,769 | 5/1987 | Cuomo et al. | 204/192.11 X |
| 4,892,751 | 1/1990 | Miyake et al. | 427/54.1 X |
| 4,923,585 | 5/1990 | Krauss et al. | 204/298.03 X |
| 4,933,063 | 6/1990 | Katsura et al. | 204/298.09 X |
| 4,933,065 | 6/1990 | Seiler | 204/298.09 X |

*Primary Examiner*—Nam X. Nguyen
*Attorney, Agent, or Firm*—Wenderoth, Lind & Ponack

[57] ABSTRACT

A sputtering apparatus to be used in reactive sputtering which mixes a reactive gas into a discharge gas so as to form chemical compound thin membranes.

A heating means is provided for heating the target. Light such as infrared rays or the like, and laser beams are ideal as the heating means. A thermometer for applying light is preferable to measure the temperature of at least one portion of the target for controlling the heating condition of the target. The composition of the thin membrane to be formed by the reactive sputtering can may be made constant.

2 Claims, 4 Drawing Sheets

SPUTTERING APPARATUS

BACKGROUND OF THE INVENTION

The present invention generally relates to a sputtering apparatus and more particularly, to a sputtering apparatus to be used in a reactive sputtering, which mixes a reactive gas into discharge gas so as to form compound thin membranes.

Generally, a reactive sputtering apparatus is generally used so as to form the compound thin membrane by a reactive sputtering method of mixing the reactive gas into the discharge gas or to optionally vary the composition ratio of the compound by the controlling of the flow amount of the reactive gas.

The above-described reactive sputtering apparatus will be described hereinafter with reference to FIG. 6, which is a sectional view of the conventional sputtering apparatus, including a chamber 24 capable of effecting an exhaust operation therein, a basic plate 25 disposed within the chamber 24 so as to form thin membranes, a basic plate holder 26 for retaining the basic plate 25 so as to turn it on its own axis or to revolve around the sun, a metallic target disposed opposite to the basic plate 26, a backing plate 28 for retaining the target 27, cooling water supply means 29 for cooling the backing plate 28, Ar gas supply means 30, $O_2$ supply means 31, and valves 32, 33 for keeping the gas flow amount constant.

A high voltage is applied on the target 27 and the backing plate 28 which become cathodes so as to generate the glow discharge. Particles which are sputtered, scattered from the target 27 are reacted with the $O_2$ gas from supply 31 so as to be accumulated on the basic plate 25. At this time when Te is used as the target 27, the reaction of Te with $O_2$ is caused by plasma on the surfaces of the target 27 so as to form Te oxide on the surfaces of the target 27. The O/Te ratio of the Te oxide thin membrane is determined by the ratio of the oxide forming speed and the sputtering speed of the target 27. The $O_2$ gas partial pressure, i.e., $O_2$ gas amount which is correlated to the oxide forming speed is varied, so that the O/Te ratio of the Te oxide membrane may be varied.

SUMMARY OF THE INVENTION

Accordingly, an object of the present invention is to provide a sputtering apparatus, which can overcome the problem that the O/Te ratio may increase as shown in FIG. 7 through the gradual oxidation of the Te target and the varied oxide forming speed when metal which is likely to be oxidized, such as Te, is used as a target material.

Another important object of the present invention is to provide a sputtering apparatus, which can overcome a big problem in production that the $O_2$ gas amount must be constantly corrected or the sputtering cleaning is necessary by the Ar ion of the Te target to remove the excessive oxidation layer on the surfaces in a case where the reproducibility is strictly demanded, as, with respect to light recording membranes in the variation of the O/Te ratio as described hereinabove.

For the solution of the conventional problems, the present invention is characterized in having a heating means for heating the targets. Light such as infrared rays or the like, and laser light are ideal as the heating means. It is preferable to provide a thermometer so as to measure the temperature of at least one portion of the target for controlling the heating condition of the target.

According to the present invention, by the heating of the target by the heating means, the speed of the oxidizing and the sputtering on the target surfaces by the joint use of the thermal oxidizing reaction on the target surfaces is balanced, so that the composition of the thin membrane to be formed by the reactive sputtering may be made constant.

BRIEF DESCRIPTION OF THE DRAWINGS

These and other objects and features of the present invention will become apparent from the following description of the preferred embodiment thereof with reference to the accompanying drawings, according to which.

DETAILED DESCRIPTION OF THE INVENTION

Figure 1:
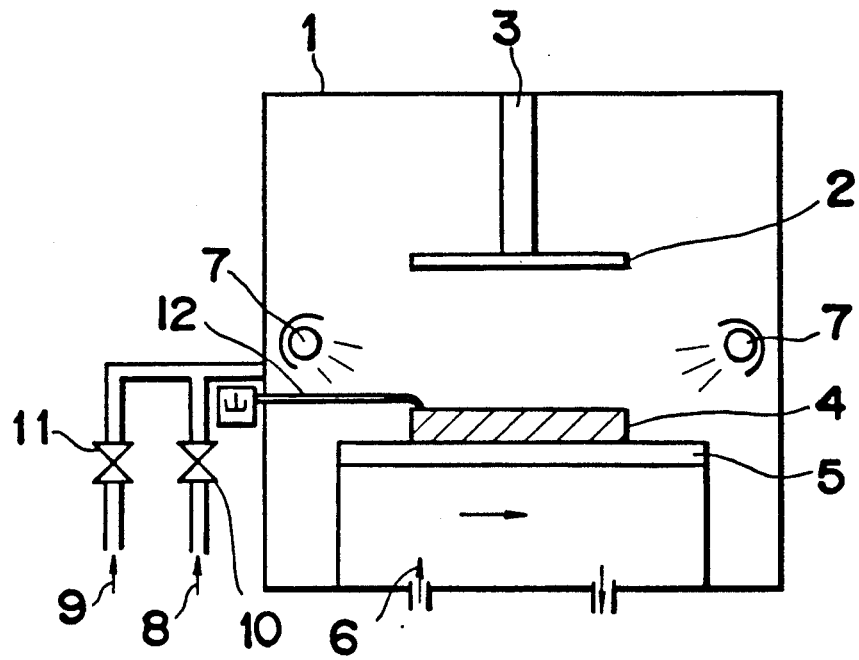
FIG. 1 is a sectional view of a sputtering apparatus in a first embodiment of the present invention.

Before the description of the present invention proceeds, it is to be noted that like parts are designated by like reference numerals throughout the accompanying drawings.

Referring now to the drawings, there is shown in FIGS. 1 through 4, a sputtering apparatus according to a first embodiment of the present invention, which includes a chamber 1 capable of effecting an exhaust operation within, a basic plate 2 disposed within the chamber 1 so as to have thin membranes formed thereon, a basic plate holder 3 for retaining the basic plate 2 to turn it at its axis or to revolve around the sun in an orbital motion, a metallic target 4 disposed opposite to the basic plate 2, a backing plate 5 for retaining the target 4, circulation water supply means 6 for supplying cooling water for cooling the backing plate 5, an infrared heater 7 for heating the surfaces of the target 4, Ar gas supply means 8 and $O_2$ gas supply means 9, valves 10, 11 for keeping the amount of gas flow constant, and a temperature system 12 applying light so as to measure the target surface temperature.

A high voltage is applied upon a target 4 and the backing plate 5 which become cathodes so as to generate a glow discharge. Metallic particles which are sputtered and scattered from the target 4 are reacted to $O_2$ gas from supply 9 and become a compound so as to be accumulated on the basic plate 2. At this time when Te is used as the material of the target 4, a Te oxidation membrane is obtained as a thin membrane. Also, by the variation of the opening of the valve 11, the amount of the $O_2$ gas from supply 9 is varied, thus making it possible to vary the O/Te ratio of the Te oxidation membrane.

When the $O_2$ gas is mixed into the Ar gas from supply 8 in a manner so as to sputter the Te target 4, the reaction of the Te with the $O_2$ is caused on the surfaces of the target 4 to form the Te oxide on the surfaces of the target 4. The O/Te ratio is determined by the ratio between the oxide forming speed and the sputtering speed of the target 4. In order to keep the O/Te ratio constant, it is required to make the oxide forming speed and the sputtering speed constant.

In the present embodiment, the target 4 is heated by the infrared heater 7 to jointly cause the oxidation reaction by the heat on the surfaces of the target 4. The Te oxidation membrane with a given O/Te ratio is obtained even under an $O_2$ gas partial pressure lower as compared with a case where only the oxidation reaction by the conventional plasma is provided. In order to keep the O/Te ratio constant during the oxide reaction by the conventional plasma only with respect to the variation in the material quality and the shape of the target 4 during the long hours' continuous sputtering, the $O_2$ gas flow amount was required to be constantly corrected or it is required to effect sputter cleaning ion of the Te target by Ar ions. In the case where the oxidation reaction by the heat as in the present embodiment is jointly used, the target temperature which is one of parameters for determining the chemical reaction speed on the surfaces of the target can be kept constant. The Te oxidation membrane having a stable O/Te ratio can be formed, and the sputtering under a low $O_2$ gas partial pressure can be effected, with the improvement that the metal of the target 4 is oxidized as time passes and the reaction is stabilized.

Figure 2:
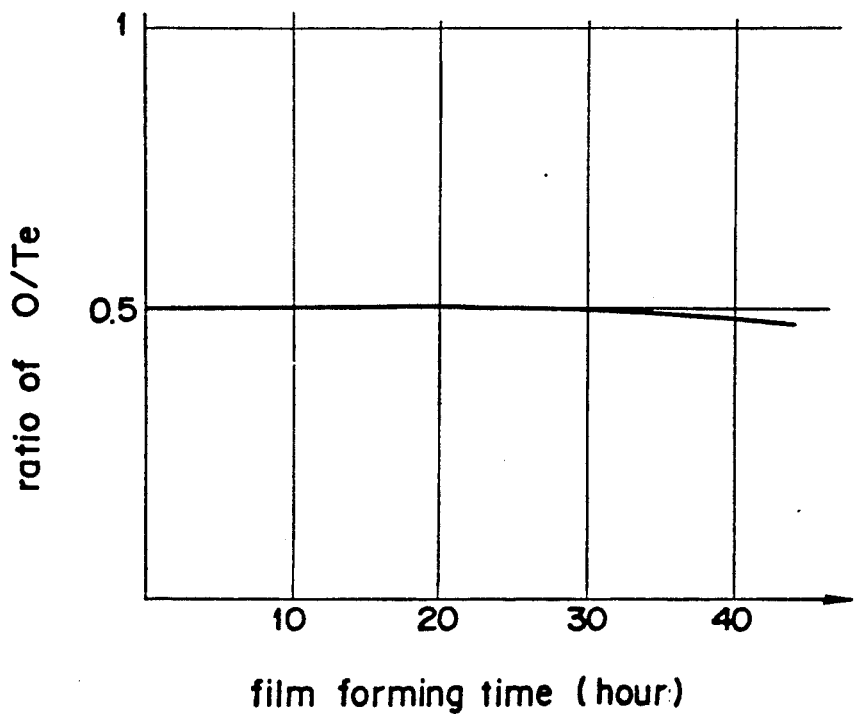
FIG. 2 is a graph showing the relationship between the membrane forming time and the O/Te ratio in a case where the embodiment of the sputtering apparatus has been used.

FIG. 2 is a graph showing the relationship between the membrane forming time and the O/Te ratio in a case where the sputtering apparatus in the present embodiment has been used. The sputtering apparatus in the present embodiment makes it possible to provide long hours of stable membrane forming operation.

Figure 3:
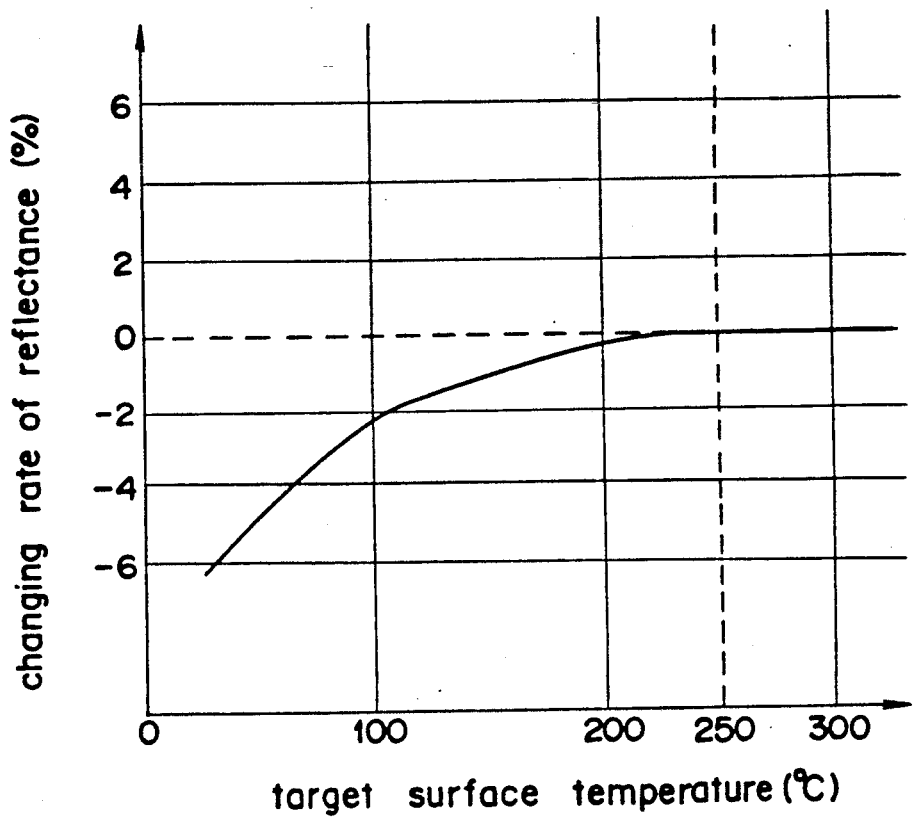
FIG. 3 is a graph showing a target surface temperature and a reflection rate variation in a case where the embodiment of the sputtering apparatus has been used.

FIG. 3 shows the target surface temperature and the reflection rate variation of the Te oxidation membrane in a case where the Te is used as the target 4 to form the membrane. There is correlation between the O/Te ratio and the Te oxidation membrane reflection ratio. When the O/Te ratio is larger, the reflection ratio becomes smaller. When the target surface has been heated at 250° C. or more as shown in the graph, the membrane which has a smaller reflection ratio variation and is more stable can be made.

Figure 4:
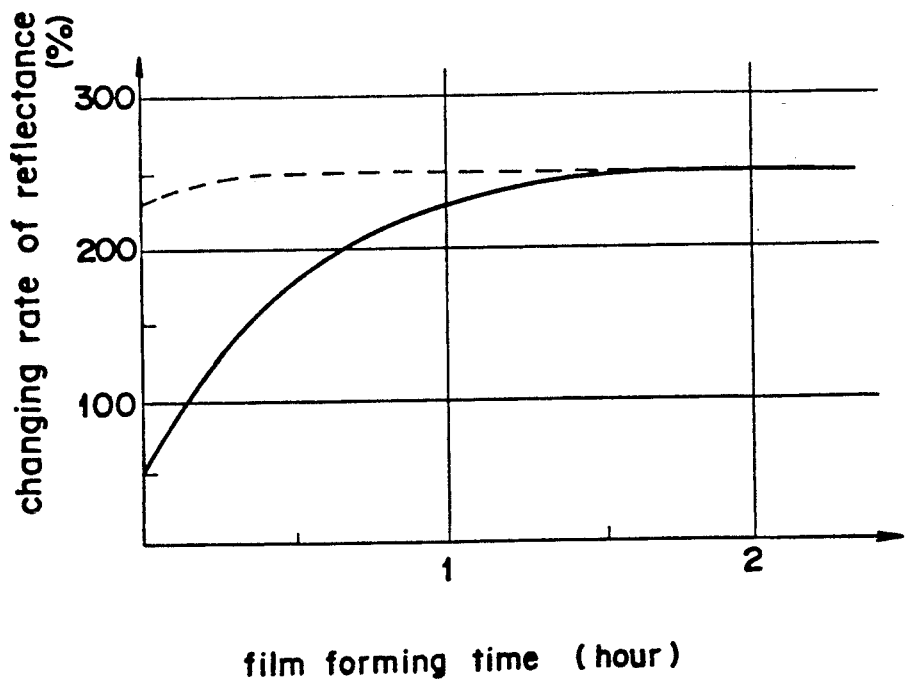
FIG. 4 is a graph showing the variation in the target surface temperature after the sputtering membrane forming operation in a case where the embodiment of the sputtering apparatus has been used.

FIG. 4 shows changes in the target surface temperature after the sputter membrane forming operation. When the circulation of water for controlling heating without the lamp heating, as shown by the solid line, the target surface temperature rises gradually after the start of the sputtering, and is soon stabilized. The chemical reaction immediately after the start of the sputtering is not stabilized. A membrane which has a smaller O/Te ratio than the given O/Te ratio is formed. According to the lamp heating in the present embodiment as shown by the dashed line, the target surface temperature is stabilized quickly after the start of the sputtering, so that the Te oxidation membrane with the given O/Te ratio can be formed with better reproducibility. Since only the surfaces of the target 4 are heated with the lamp heating, the whole target 4 is not heated, which can cause the solder, which is used to secure the target 4 on the backing plate 5, to melt. This prevents the target 4 from coming off.

The heating operation may be effected with the reproducibility of $\pm 3°$ C. or lower through the controlling of the heating condition by the use of a thermometer 12 applying light for measuring the target surface temperature, so that the oxide forming speed be made constant. Since a measuring instrument applying the light as such thermometer 12 is used, the measuring operation can be effected independently of the influences of the discharge noises even when the high frequency sputtering is used with the normal DC sputtering being impossible to effect as in an insulator and a dielectric target.

Figure 5:
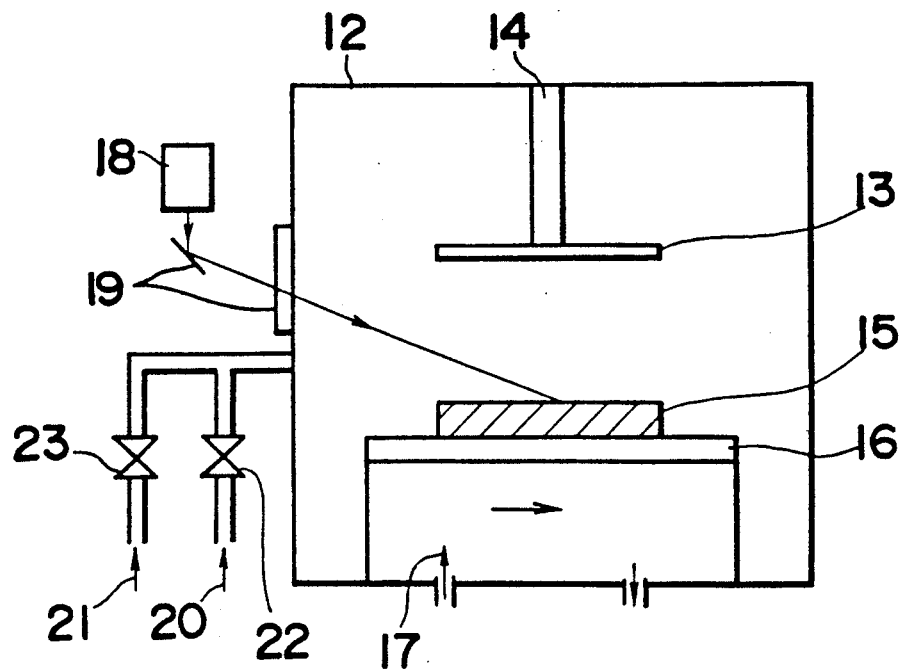
FIG. 5 is a sectional view of a sputtering apparatus of a second embodiment of the present invention.
Figure 6:
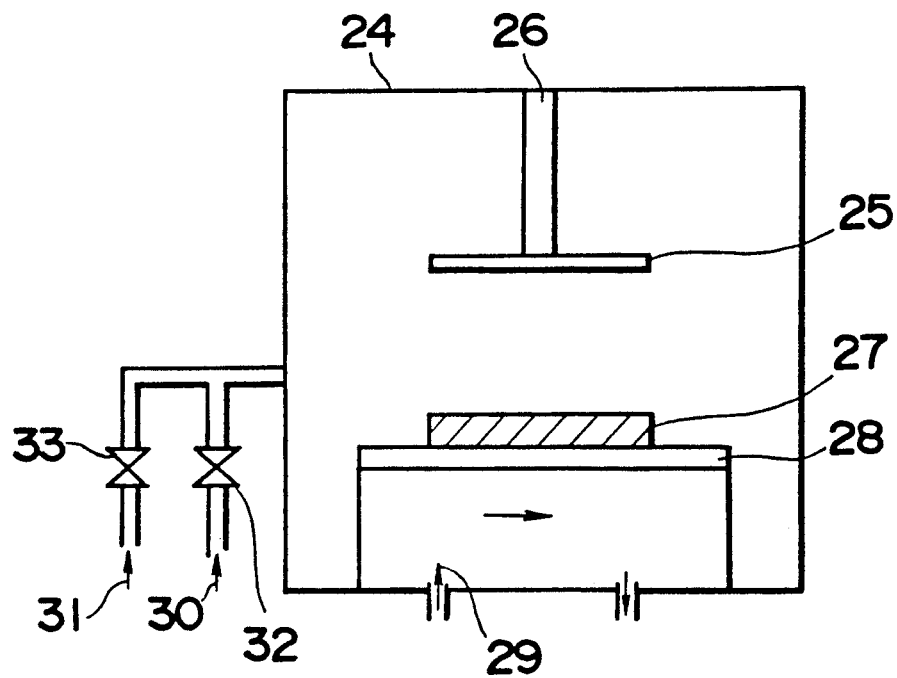
FIG. 6 is a sectional view of a conventional sputtering apparatus.
Figure 7:
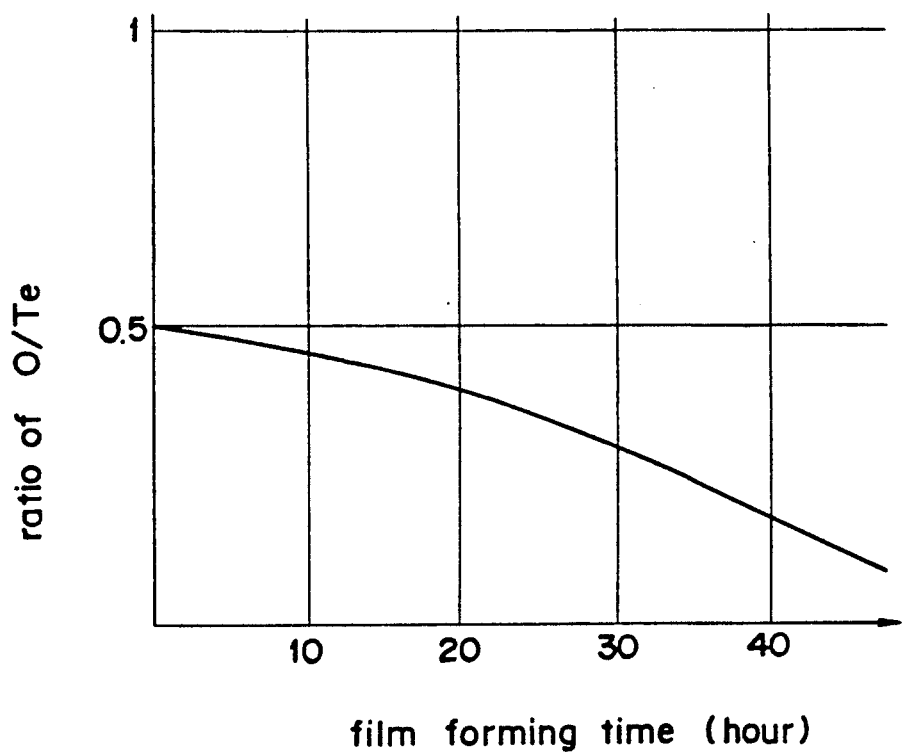
FIG. 7 is a graph showing the relationship between the membrane forming time and the O/Te ratio for the conventional sputtering apparatus.

There is shown in FIG. 5, a sputtering apparatus according to a second embodiment of the present invention, which includes a chamber 12 capable of effecting an exhaust operation therein, a basic plate 13 disposed within the chamber 12 so as to form thin membranes, a basic plate holder 14 for holding the basic plate 13 to turn it on its axis or to revolve around the sun in an orbital motion, a metallic target 27 disposed opposite the basic plate 14, a backing plate 16 for holding the target 15, circulating water supply means 17 for supplying cooling water for cooling the backing plate 16, a laser beam source 18 for illuminating the surfaces of the target 15, an optical system 19 for scanning the surfaces of the target 15 by the laser beam thereof, Ar gas supply means 20, $O_2$ gas supply means 21, valves 22, 23 for keeping the amount of gas flow constant.

A high voltage is applied to the target 15 and the backing plate 16 which become cathodes so as to generate the glow discharge. Metallic particles $O_2$ gas which are scattered from the target 15 are reacted to $O_2$ gas and become a compound so as to be accumulated on the basic plate 13. At this time when Te is used as the material of the target 15, a Te oxidation membrane is obtained as the thin membrane. Also, by the variation of the opening of the valve 23, the flow amount of the $O_2$ gas 21 is varied.

When the 02 gas 20 is mixed into the Ar gas 20 in this manner so as to sputter the Te target 15, the reaction of the Te with the $O_2$ is caused on the surfaces of the target 4 to form the Te oxide on the surfaces of the target 15. The O/Te ratio is determined by the ratio between the oxide forming speed thereof and the sputtering speed of the target 15. In order to keep the 0/Te ratio constant, it is necessary to make the oxide forming speed and the sputtering speed.

In order to keep the oxide forming speed constant, it is required to keep the target surface temperature constant which is one of the parameters for deciding the chemical reaction speed on the surface of the target 15. In the sputtering apparatus, a magnetron for confining the plasma by a magnetic field is normally used. In such a case, the temperature distribution on the target surface becomes unequal, with the plasma confining region becoming high at temperature. In the recent years, there is a method of moving the plasma confining region by the use of coils or the like so as to improve the material efficiency of the target 15. In this case, the temperature distribution of the target 15 is varied in terms of time to make the oxide forming speed unstable.

In the present embodiment, the heating operation is effected so that the temperature distribution within the target face will become uniform through changes in the scanning region of the laser beam and the scanning speed thereof by the optical system 19. Thus, the oxide forming speed is kept constant, so that the membrane which has a stable in O/Te ratio and superior in composition reproducibility can be formed.

Although in the embodiment, the oxidation by laser beam heating is effected, the target oxidation can be by the optical chemical reaction of short wavelength lasers such as EKISHIMA lasers, secondary higher harmonic YAG lasers and so on.

As is clear from the foregoing description, according to the arrangement of the present invention, the composition of the thin membrane to be formed by the reactive sputter can be made constant.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A sputtering apparatus comprising:
   a vacuum container having means connected thereto for maintaining a vacuum in said container;
   a gas introducing means for introducing oxygen and argon gas into said vacuum container in the vicinity of a target of a metal to be sputtered;
   a plasma generating means connected across the target and a base plate support which are within said vacuum container for forming a plasma near the target;
   a heating means directing light onto the target for heating the target;
   a temperature sensing means for sensing the temperature of the target; and
   means responsive to the sensed temperature of the target for controlling the amount of light directed onto the target for keeping the temperature of the surface of the target at a temperature for keeping the rate of oxidation of the metal of the target constant at the rate of flow of oxygen and argon gas, whereby the oxygen metal ratio on the surface of the target can be kept constant and the oxidation reaction stabilized so as to the make sputtering under a low oxygen partial pressure possible and the composition of the thin layer of metal formed by the sputtering can be made constant over long periods of time.

2. A sputtering apparatus as claimed in claim 1 in which said temperature sensing means is a thermometer including means for applying light to the target for measuring the temperature of at least one portion of the target.

* * * * *